United States Patent [19]
Asahina

[11] Patent Number: 5,342,806
[45] Date of Patent: Aug. 30, 1994

[54] METHOD FOR FABRICATING A SEMICONDUCTOR DEVICE HAVING A CONDUCTOR STRUCTURE WITH A PLATED LAYER

[75] Inventor: Michio Asahina, Nagano, Japan

[73] Assignee: Seiko Epson Corporation, Tokyo, Japan

[21] Appl. No.: 780,455

[22] Filed: Oct. 22, 1991

Related U.S. Application Data

[63] Continuation of Ser. No. 151,361, Feb. 2, 1988, abandoned.

[30] Foreign Application Priority Data

| Feb. 2, 1987 | [JP] | Japan | 62-22001 |
| May 21, 1987 | [JP] | Japan | 62-124912 |
| May 21, 1987 | [JP] | Japan | 62-124913 |
| Dec. 17, 1987 | [JP] | Japan | 62-319221 |

[51] Int. Cl.$^5$ .................. H01L 21/44; H01L 21/48
[52] U.S. Cl. .................. 437/195; 437/198; 437/200; 437/230; 437/247
[58] Field of Search .................. 357/67 S, 67 R; 437/230, 195, 189, 200

[56] References Cited
U.S. PATENT DOCUMENTS

| 4,113,578 | 9/1978 | Del Monte | 437/230 |
| 4,162,781 | 1/1980 | Hooper et al. | 427/90 |
| 4,593,454 | 6/1986 | Baudrant et al. | 357/67 S |
| 4,619,887 | 10/1986 | Hooper | 156/642 |
| 4,672,419 | 1/1987 | McDavid | 357/67 S |
| 4,725,877 | 2/1988 | Brasen et al. | 357/67 R |
| 4,761,677 | 8/1988 | Sasaki | 357/67 R |

OTHER PUBLICATIONS

IBM Technical Disclosure Bulletin, "Electromigration improvement of Al-Cu or Au Conductors," vol. 21 No. 12, May 1979, by J. K. Howard.

*Primary Examiner*—Olik Chaudhuri
*Assistant Examiner*—H. Jey Tsai
*Attorney, Agent, or Firm*—Spensley Horn Jubas & Lubitz

[57] ABSTRACT

A semiconductor device composed of: a substrate having a doped semiconductor region, a gate wiring, a lower conductor structure, an insulating layer overlying the lower structure and having at least one through opening extending to the lower conductor structure, and an upper conductor structure connected to the lower conductor structure via the through opening, wherein at least one of the conductor structures is formed of at least one layer of a metal, a metal silicide, a metal nitride, a metal carbide or a conductive oxide film, and a metal plating layer disposed on and adhering to the at least one layer.

3 Claims, 10 Drawing Sheets

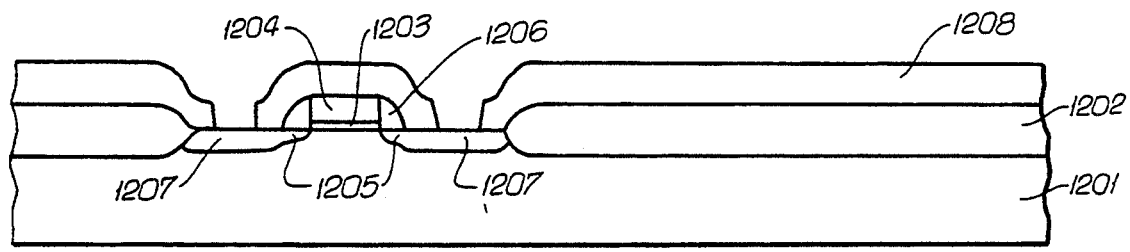
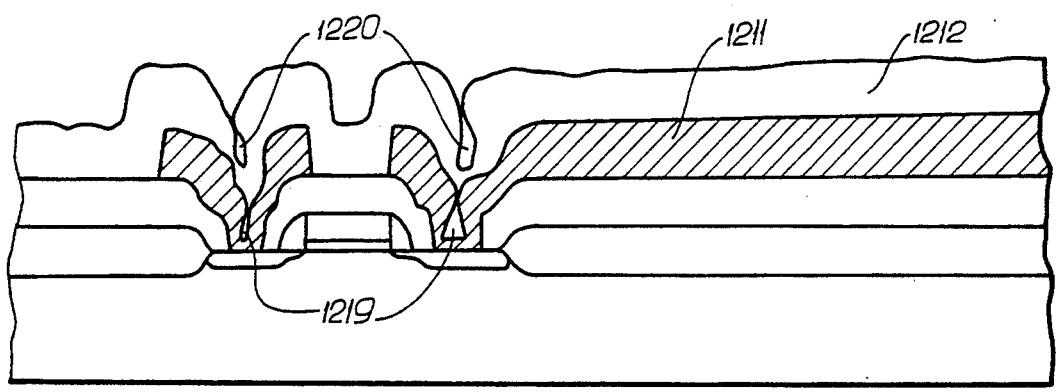
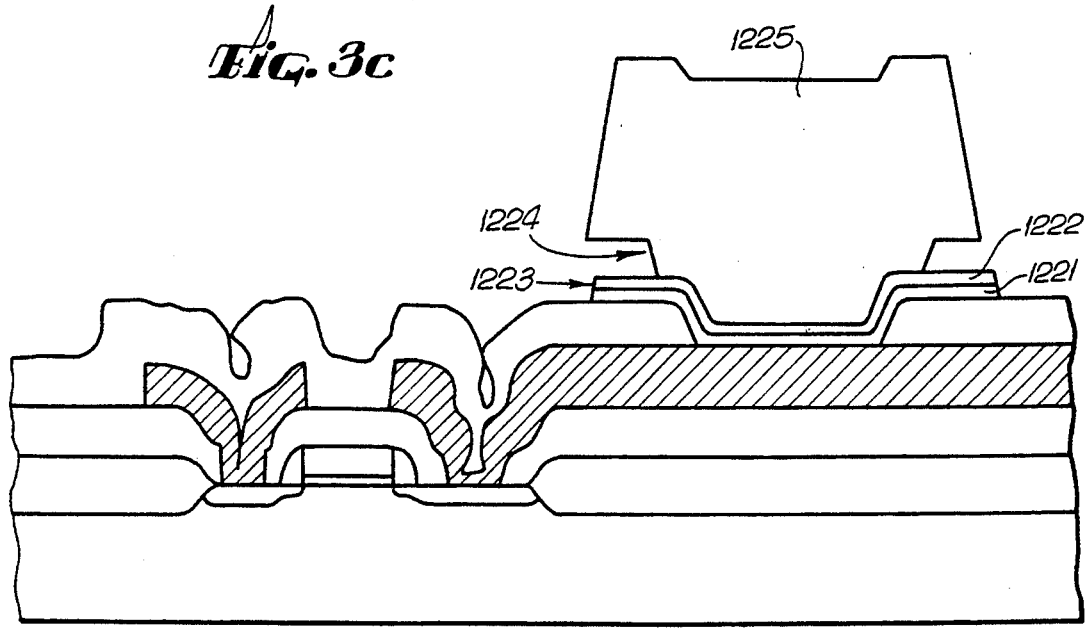

METHOD FOR FABRICATING A SEMICONDUCTOR DEVICE HAVING A CONDUCTOR STRUCTURE WITH A PLATED LAYER

This is a continuation of application Ser. No. 07/151,361 filed on Feb. 2, 1988, now abandoned.

BACKGROUND OF THE INVENTION

The present invention relates to semiconductor devices, and in particular to conductive path layers for such devices.

A conventional semiconductor device, in this case a field-effect transistor, is shown in FIG. 1. The illustrated structure includes a substrate 1000, of silicon for example, in which are formed a low density impurity (i.e. lightly doped) diffused region 1001 and a high density impurity (i.e. heavily doped) diffused region 1002, these regions forming source and drain regions of the transistor. An oxide film region 1003 is disposed on substrate 1000 and a gate electrode 1004 is disposed on oxide film region 1003. Gate electrode 1004 and region 1003 are surrounded by a sidewall layer 1005 and the transistor is surrounded and isolated by an insulating layer 1006. An interlayer insulating film 1007 is disposed above layer 1006 as well as regions 1001 and 1002 and electrode 1004.

Aluminum wiring paths 1008 are connected to regions 1001 and 1002. Wiring paths 1008 and film 1007 are covered by a passivation layer 1009.

As commonly occurs in conventional manufacturing processes, the structure contains various flaws, such as a protrusion 1010 or a void 1011 on aluminum path 1008 and/or a void 1012 in passivation layer 1009.

As mentioned above, in conventional semiconductor devices, the single-layer wiring 1008 composed of Al or Al-Si (1%) and so on is formed by the methods of sputtering, vapor deposition, etc.

FIGS. 2a and 2b illustrate successive stages in one conventional semiconductor device manufacturing process. In FIG. 2a, a semiconductor substrate 1101 has a semiconductor device region which is surrounded by an isolating insulating layer 1102. To form the semiconductor device, a gate insulating film 1103 is formed on substrate 1101 and a gate electrode 1104 is then formed on film 1103. Electrode 1104 may be a polycide, i.e. two layers of polysilicon and metal silicide having a high melting point. At opposite sides of electrode 1104, a low density impurity region 1105 and a high density impurity region 1107 are diffused into substrate 1101, these constituting source and drain regions. A sidewall film 1106 is formed around electrode 1104 and film 1103. Then, an insulating layer 1108 is deposited on layer 1102, electrode 1104, film 1106 and regions 1105 and 1107. Openings are formed in layer 1108 and a first layer of conductive regions 1109 is deposited on layer 1108 and in the openings formed in that layer to form contacts to regions 1105 and 1107. Conductive regions 1109 are composed of Al or Al-Si. Regions 1109 may be produced by sputtering.

Then, as shown in FIG. 2b, a further insulating layer 1112 is deposited on regions 1109 and the exposed parts of layer 1108, followed by a second layer 1113 of conductive regions, which are connected to regions of layer 1109 via openings formed in layer 1112. Then a further insulating layer 1118 is formed on regions 1113 and the exposed parts of layer 1112.

The conductive layers are formed by thermal sputtering and photoetching.

Thermal sputtering constitutes an effective method for depositing conductive layer 1109, for example of Al, on insulating layer 1108 and the exposed regions of substrate 1101 so that no spaces exist between layer 1109 and the underlying surfaces. Thus, this technique exhibits a good "throwing power", which denotes the degree to which the applied layer fills all underlying spaces, for the extent to which it covers the underlying surfaces.

During the subsequent heating process, projections such as shown at 1116 grow. These projections promote current leakage between insulating layers. Voids, or recesses, 1117 may also form in the conductive regions.

FIGS. 3a, b and c show three stages in the manufacture of another conventional semiconductor device. Every part shown in FIG. 3a corresponds to the part whose reference numeral has the same last two digits in FIG. 2a.

After openings are formed in layer 1208, a conductive metal pattern 1211 is deposited on layer 1208 and in the openings previously formed in that layer. Then metal 1211 and the exposed parts of layer 1208 are covered by a further insulating layer 1212.

Then, referring to FIG. 3c, an opening is formed in layer 1212 to expose metal 1211. A Cr layer 1221 and an Au layer 1222 are then deposited in the opening for the plating electrode. Photoetching is performed with the aid of a mask having the shape 1223. Then Au plating 1225 is performed through a resist mask 1224. The AU plating 1225 forms a bump, or button, electrode which constitutes an external connector for conducting an input or output current of the semiconductor device.

With conventional methods, a conductive layer, for example of Al, cannot be formed on the lower insulating layer and the conductive layer then be exposed by a contact opening so as to leave no space between the Al layer and the underlying insulating layer or the conductive layer cannot be exposed by a very small passage opening having a high aspect ratio. In addition, although known structures do not necessarily result in a burnout, or a broken conductor, initially, the reliability of known structures of this type is very low.

With conventional manufacturing processes, as shown in FIGS. 1 and 3b, cracks and voids 1012, 1220 are formed in passivation layer 1009, 1212. These cracks and voids adversely influence the moisture resistance of the semiconductor device.

Further, low melting point aluminum alloys develop protrusions such as 1010, 1116 and voids such as 1011, 1012, 1117, 1219 during the thermal process, and promote penetration of aluminum into shallow diffused regions, junction spikes, etc.

By contacting the Al alloy and Si substrate directly, the deposited Si layer is formed at the interface, thereby producing a step contact resistance and variations in the contact resistance. In particular, in devices having dimensions in the submicron range, the above undesirable characteristics become particularly troublesome. In fact the prior art has reached a lower size limit for such devices for achieving satisfactory reliability.

Furthermore, with conventional Al conductive paths, it is impossible to prevent stress migration, in which strong tensile stress remains in the conductive paths, associated with compressive stress in the adjacent passivation layer, thereby resulting in a creep diffusion phenomenon which causes burnout of the conductive paths.

Moreover, electrode migration has already reached the limit of device reliability and conductive path material having high reliability is needed to allow a stable flow of high current levels.

According to the conventional art, when the interlayer insulating film 1112 is formed as in FIG. 2(b), a projection 1116 grows into the surface and side of conductive layer 1109, whereupon a current short may form between the first conductive layer 1109 and the second conductive layer 1113. And, if a compressive plasma nitride layer or the like is used as the passivation layer 1118, the void 1117 due to stress migration occurs in Al layer 1113. Further, there occurs burnout and deterioration of the electron migration resistance. Where the conductive layer is not heated, less of a projection is produced. However, the throwing power at the contact portion becomes poor, and the stress migration becomes weak.

Further, according to the conventional art, when the contact openings in the insulating layer, e.g. layer 1108, are small and the aspect ratio of the layer is large, the coverage at the contact portion by the conductive material becomes poor. In particular, at the time of non-heating the crack 1219 occurs as shown in FIG. 3b. Further burnout occurs and the electro or stress migration resistance also deteriorates. The worse the coverage of the conductive portion, the worse the throwing power of the passivation layer at the top of the structure. Thereby, the occurrence of voids like 1220 substantially reduce the moisture resistance of the device.

SUMMARY OF THE INVENTION

It is an object of the present invention to use conductive material with metal plating in order to produce an improved semiconductor device having high reliability and in which stress migration and electro migration problems are eliminated.

A further object of the invention is to prevent, or at least minimize, the formation of projections and voids on the conductive layers and adjacent insulating layers, thereby permitting the fabrication of reliable devices with dimensions in the submicron range.

Another object of the invention is to provide conductive layers or bodies, such as button electrodes, having at least one electrolessly or electrolytically deposited plating layer of nickel, copper or gold.

A further object of the present invention is to provide semiconductor device conductor structures exhibiting extremely high performance capabilities, and in which, after formation of a contact opening, a metal plating conductive structure can be formed on a single layer or multi-layer structure of metal, metal nitride, metal silicide, or metal carbide, in the form of a thin film, thereby creating conductor structures which are free of protrusions, and have high electro migration resistance, high stress migration resistance, good step coverage, and a stable and low contact resistance even when exposed to high temperatures.

Yet another object of the invention is to provide conductor structures which can be used for connection to diffused, or doped, regions of a semiconductor device, as well as to gate electrodes, and which can provide connections through contact openings.

According to the invention, conductive structures can be formed, employing electroless plating, only within contact openings, and plating layers can be deposited electrolessly or electrolytically through various kinds of barrier metal.

The above and other objects are achieved, according to the present invention, in a semiconductor device comprising: a substrate having a doped semiconductor region, a gate electrode, a lower conductor structure, an insulating layer overlying the lower structure and having at least one through opening extending to the first conductor structure, and an upper conductor structure connected to the lower conductor structure via the through opening, in that at least one conductor structure is composed of: at least one layer of a metal, a metal silicide, a metal nitride, a metal carbide or a conductive oxide film; and a metal plating layer disposed on and adhering to the at least one layer.

BRIEF DESCRIPTION OF THE DRAWING

FIGS. 3(a), (b), and (c) are cross-sectional views of successive stages in the fabrication of a third embodiment of a semiconductor device according to the prior art.

DESCRIPTION OF THE PREFERRED EMBODIMENTS

Embodiment 1

Figure 4A:
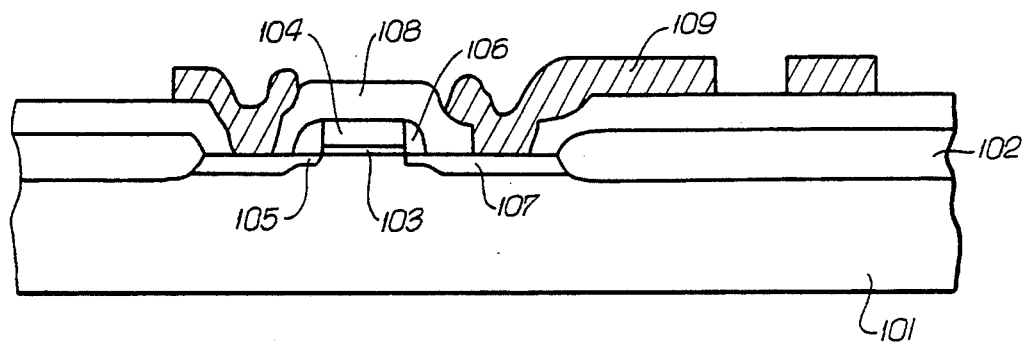
FIGS. 4(a), (b), and (c) are cross-sectional views of successive stages in the fabrication of a first embodiment of a semiconductor device according to the present invention.
Figure 4B:
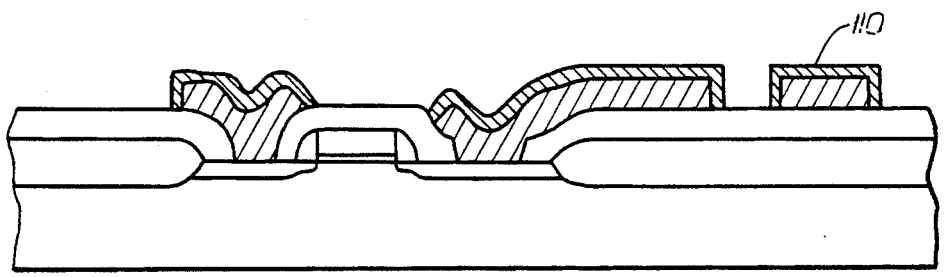
Figure 4C:
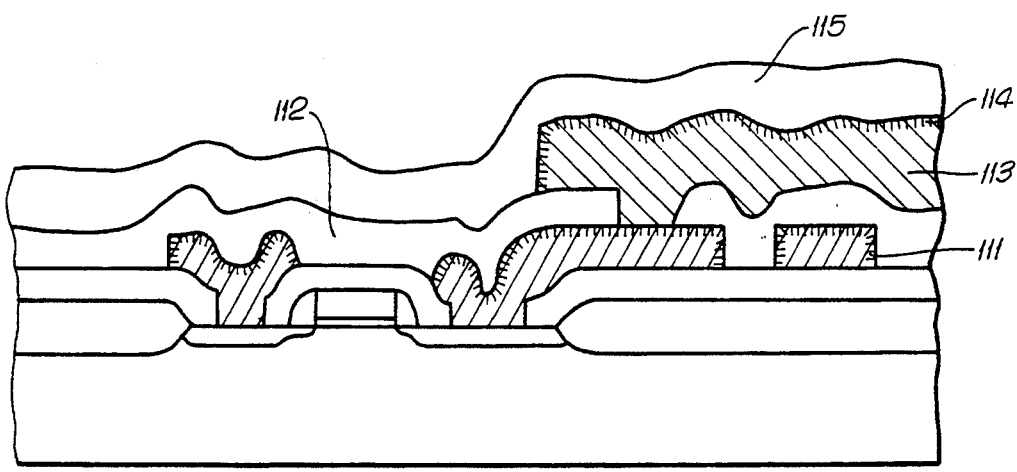

FIGS. 4(a) to (c) show stages in the manufacture of one embodiment of the present invention. In this embodiment 1 metal plating is formed on the aluminum conductive layers. Then, it is possible to form an alloy of the aluminum and the plating metal by thermal treatment. In FIGS. 4, 101 is a semiconductor substrate, 102 is a device isolating insulating layer, 103 is a gate insulating film, 104 is a gate electrode, 105 is a low density impurity diffused region, 106 is a sidewall film, 107 is a high density impurity diffused region, 108 and 112 are interlayer insulating layers, 109 and 113 are aluminum conductive path layers, 110 is an electroless Ni plating layer, 111 and 114 are resulting Ni-P-Al diffused layers, and 115 is a plasma nitrided layer. It is to be understood that all references herein to electroless plating are intended to encompass appropriate types of chemical plating procedures.

Figure 2A:
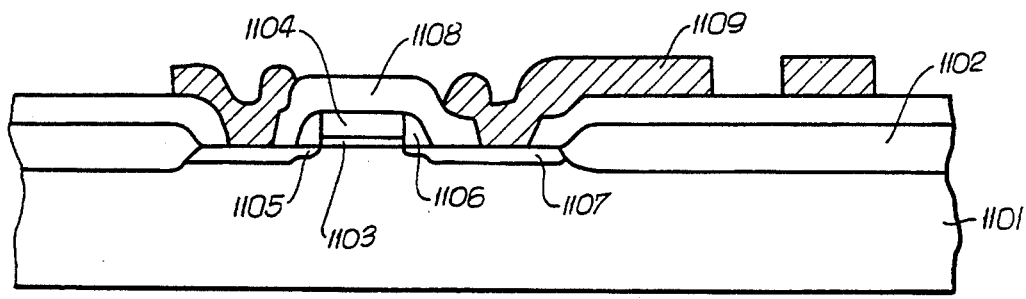
FIGS. 2(a) and (b) are cross-sectional views of successive stages in the fabrication of a second embodiment of a semiconductor device according to the prior art.

The stage shown in FIG. 4a is achieved in the manner described with reference to FIG. 2a. Layer 109 is formed by sputtering a 5000 Å thick layer of aluminum (including Si and Cu) at a temperature of 300° C.

After layer 109 is formed into the desired conductive pattern by dry etching, the resulting device is dipped into an electroless nickel plating liquid of the hypophosphoric acid series and a 0.15 micron layer 110 of Ni is deposited only on the exposed surfaces of the conductive paths of layer 109, as shown in FIG. 4b. In this embodiment, the Sn substitution method for the electroless plating surface preparation of the aluminum conductive material is used.

Figure 1:
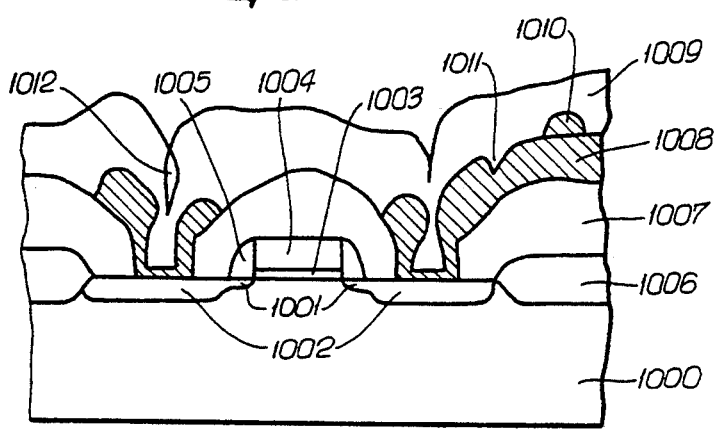
FIG. 1 is a cross-sectional view of one embodiment of a semiconductor device according to the prior art.
Figure 2B:
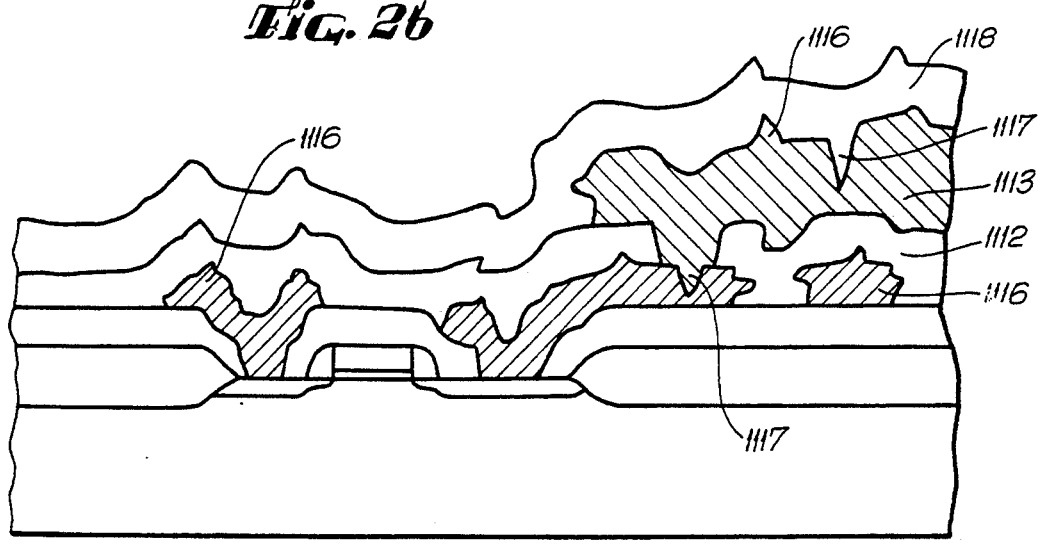

The Sn substitution method is a preliminary treatment for improving the adhesion between a metal plating layer and a metal, such as Al, which inherently has a poor adhesion to such metal plating layer. Specifically, after the formation of a Al conductive path structure, the device is dipped into a tin-containing alkaline solution so as to accumulate tin on the Al layer by the substitution method. Then a metal plating treatment is performed on the resulting tinned surface. Further, the Ni deposition material has a P content of about 8% and the deposited Ni and P are then diffused into layer 109 by a thermal treatment at 400° C. after deposition. As a result, the projections depicted in FIGS. 1-3 are entirely avoided.

In further accordance with the invention, it is possible, prior to performing electroless plating on the Al surface, to subject that surface to a zincate treatment, i.e. to form zinc on the Al surface, or zinc that surface, for the purpose of preventing the thickness of the Al layer from being reduced as a result of the electroless plating procedure.

Then, the interlayer insulating layer 112 is formed, the second layer of aluminum 113 is formed by thermal sputtering after etching of the contact opening, electroless Ni plating is performed by the same method as above, and the resulting assembly is sintered at 450° C. Then layer 115 is formed and an electrode pad is formed by photoetching of 1 micron of plasma nitrided film 115 to complete the semiconductor device.

In the present embodiment, the projections and voids due to stress are not found at all in either one of layers 109 and 113. Concerning the electro migration resistance properties, it is found that MTF (Mean Time Fail) is improved by a value of the order of $10^2$ compared to the conventional art. This is because the Ni and P diffused from the Al surface prevents Al from acting due to the current and the heating.

In other words, if a large current is conducted by a Al conductive path, Al atoms migrate to eventually cause burnout, i.e. a interruption in the current path. In addition, if the Al conductive path is heated, this causes migration of the atoms, resulting in changes in the shape of the conductive path structure. The addition of Ni and P to the Al conductors prevents, or at least minimizes, such migrations.

Moreover, there is no remarkable change in the resistance, the bonding properties, and the contact resistance and so on, and good reliability can be also obtained.

While in the present embodiment, Ni electroless plating including P is employed, it is possible to obtain the same effect from Ni electroless plating without P, or from Cu, Sn, and Au electroless plating, or from laminating plating thereof. Reference here to "laminating plating" simply designates a plating procedure in which two layers are successively applied.

It is confirmed that the method according to the present invention is excellent for improving the reliability of the conductive paths.

Needless to say, the present invention can also be applied to conductors formed by chemical vapor deposition, and to conductors of the other metals, for example polycrystalline-Si, and so on, in addition to Al sputtering.

Embodiment 2

Figure 5A:
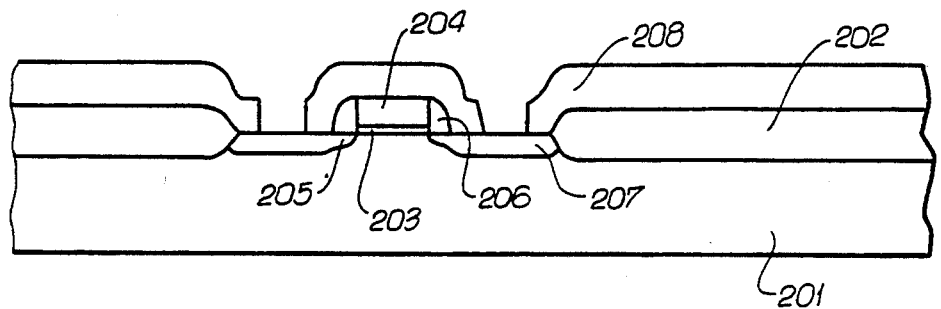
FIGS. 5(a), (b), (c), (d) and (e) are cross-sectional views of successive stages in the fabrication of a second embodiment of a semiconductor device according to the present invention.
Figure 5B:
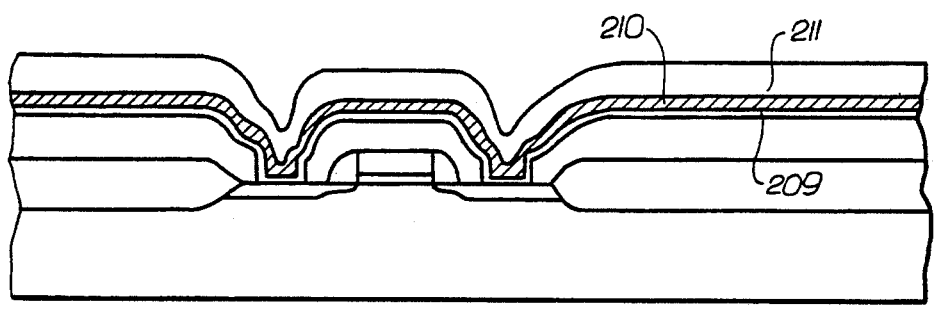
Figure 5C:
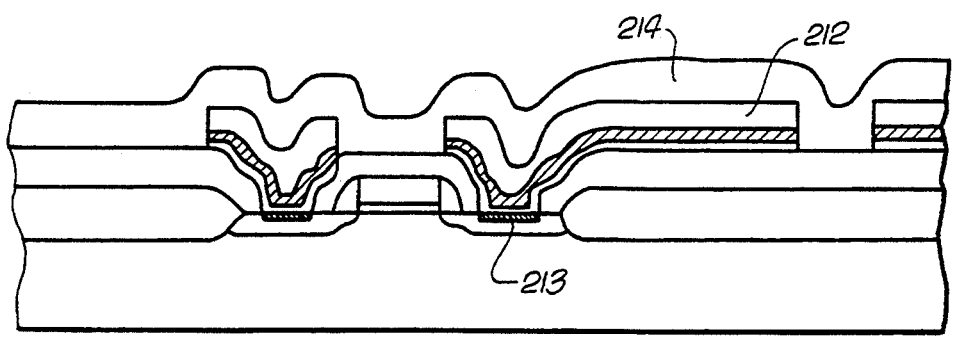

FIGS. 5(a) to (e) illustrate three stages in the manufacture of semiconductor device according to a second embodiment of the invention. In this embodiment, metal plating and aluminum conductive material are formed on a metal layer having a high melting point, also referred to as refractory metal, or two layers of metal plating are formed onto the high melting point metal layer. In FIGS. 5, the elements identified by reference numerals 201–208 are identical to those identified as 101–108 in FIGS. 4. In this embodiment, gate electrode 204 is a conductive member which can be considered as constituting the lower conductor structure of devices according to the present invention. In addition, as shown in FIG. 5b, there is provided a Ti layer 209 covered by an electroless Ni plating layer 210. An aluminum conductive layer 211 is deposited on plating layer 210 and layers 209, 210 and 211 are then etched to form the desired conductor pattern, as illustrated in FIG. 5c. After completion of the etching process, a passivation layer 214 is deposited on the upper surface of the assembly.

The structure shown in FIG. 5a is produced in the conventional manner. After completion of the manufacturing steps shown in FIG. 5a, which includes photoetching layer 208 to form contact openings, Ti layer 209 is deposited as shown in FIG. 5b to a thickness of 200 Å by sputtering. Then, the assembly is dipped in an electroless plating liquid of the hypophosphoric acid series and the electroless Ni plating layer 210 is formed to thickness of 1,000 Å. Plating layer 210 exhibits excellent step coverage and has excellent properties as a barrier metal. As other barrier metals, Ti, W, Mo, Ta, Nb, Hf, Pt, Au, etc., can be employed. Then, conductive layer 211 composed of a Al-Si-Cu alloy is deposited by sputtering, after which a photoetching process is performed to produce the conductive pattern 212 shown in FIG. 5c. After the resulting assembly has been sintered at a temperature of 450° C., passivation film 214 is formed to complete the device.

By a series of thermal processes, Ti in layer 209 at the contact regions defined by the openings in layer 208 reacts with Si in region 207 to form $TiSi_2$ layers 213 in order to form low resistance contacts. Since all of the layers 210, 211 and 213 have low contact resistance, an overall low contact resistance is created between the conductor structure and the semiconductor device.

Furthermore, since the nickel in plating layer 210 acts as a very strong barrier between conductive layer 211 and either the $TiSi_2$ layers 213 or the silicon of the semiconductor device, layer 210 effectively prevents penetration of the material of layer 211 into the layers 213 or the silicon semiconductor material, so that the contact resistance does not change even if the assembly is heated up to temperatures of the order of 550° C. Plating layer 210 provides excellent coverage and is formed so as to be buried into the contact portions, thereby effectively improving the throwing power of the conductive material of layer 211 at the contact regions.

Furthermore, electro migration, stress migration and contact migration tendencies are substantially eliminated.

Figure 5D:
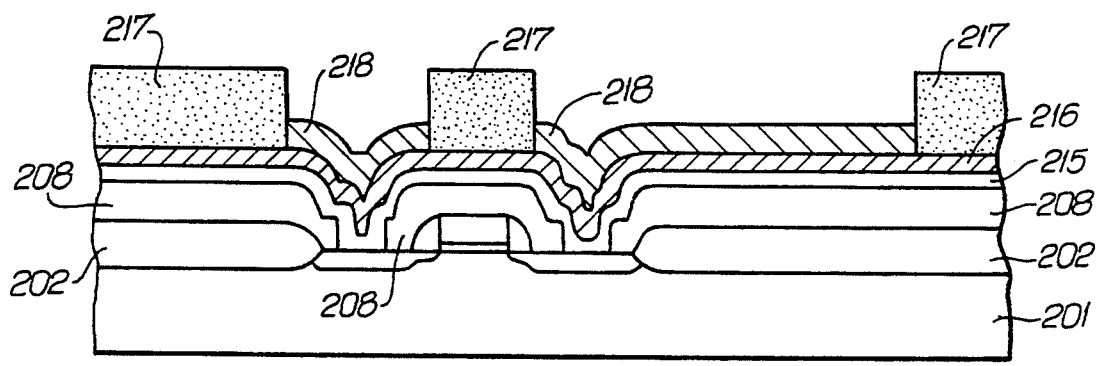
Figure 5E:
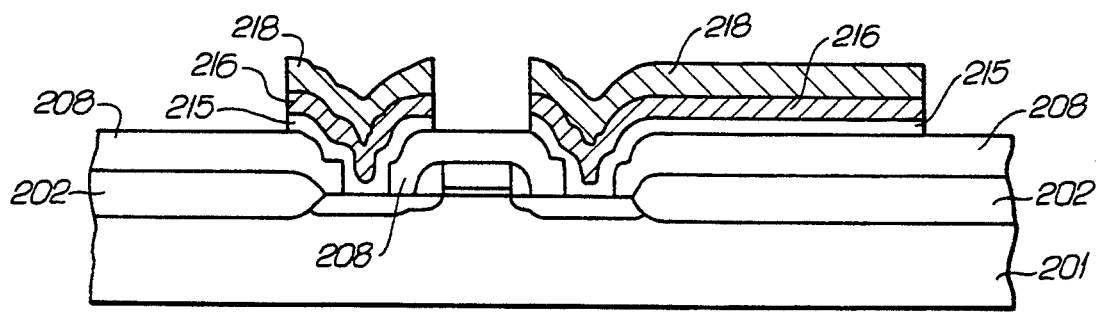

FIGS. 5(d) and (e) illustrate successive steps in an alternative to the process illustrated in FIGS. 5(b) and (c). Referring to FIG. 5(d), after the structure shown in FIG. 5(a) has been formed, two successive silicide/metal layers 215/216 are deposited on insulating layer 208 and on the surfaces of substrate 201 which were exposed by removal of portions of layer 208. Then, a resist pattern 217 is formed at locations where a conductive layer is not to be provided. A copper plating layer 218 is then deposited in the regions where the resist pattern is not present, with the silicide/metal layers serving as the plating electrode.

Then, the resist pattern 217 is removed, followed by removal of the silicide/metal layers 215, 216 in the regions not covered by copper plating 218, the copper plating 218 then acting as an etching mask. The resulting conductive structure has a low resistance and a good throwing power at the contact regions.

Furthermore, since copper has a lower resistivity and higher melting point than aluminum, it is possible to achieve a low resistance and good electro migration and stress migration properties. The plating layer composed of Ni, Cr, Pt, Rh, Cr, Au, etc., are formed as thin coatings so as to provide improved corrosion resistance and oxidation resistance for the copper conductive portions, thereby giving the conductive portions high strength and high reliability. A metal nitride/metal layer can be used in place of the silicide/metal layer 215/216.

For example, when the diffused region and the electrode, etc., are made of silicide, such as Ti-Salicide, electroless plating is achieved only within the contact openings subsequent to contact photoetching, thereby completely filling the openings. Ni, Cu and Au can also be used as the plating material. A sufficiently good effect can be obtained from the conductive portions with the conductive plating formed by depositing the silicide/metal after the openings have been completely filled, as mentioned above, and the normal Al series sputtering conductive portions can be formed such that the filling of the holes is only achieved by the plating.

The above structures can be produced even in multilayer conductive arrangements, and further through holes between the first conductive layer and the second conductive layer instead of the contact portions filled by the plating can be employed. The plating forming the conductive portions can be employed in both the first and second layers, and it is possible to form either of those layers by sputtering.

Embodiment 3

Figure 6A:
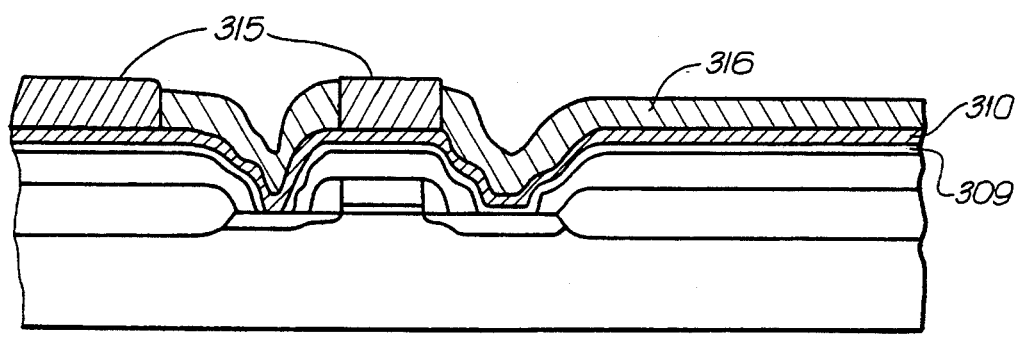
FIGS. 6(a) and (b) are cross-sectional views of successive stages in the fabrication of a third embodiment of a semiconductor device according to the present invention.

FIGS. 6(a) and (b) show successive stages in the manufacture of a semiconductive device according to a third embodiment of the present invention, in which the invention is applied to form a bump, or button, electrode contact.

After the fabrication of a structure as shown in FIG. 5(a), a Ti layer 309 is formed to a thickness of 200 Å, followed by the electroless formation of a Ni plating layer 310 to a thickness of 2,000 Å. Next, a photoresist pattern 315 is formed so that photoresist material is present at those locations where conductive material is not to be provided. Then, a conductive layer 316 of copper is electrolytically deposited on layer 310 in the regions where the resist pattern 315 is not present. The resist material 315 is then removed and the portions of layers 309 and 310 which are thus exposed are removed by ion milling, thereby forming the desired conductive pattern.

Figure 6B:
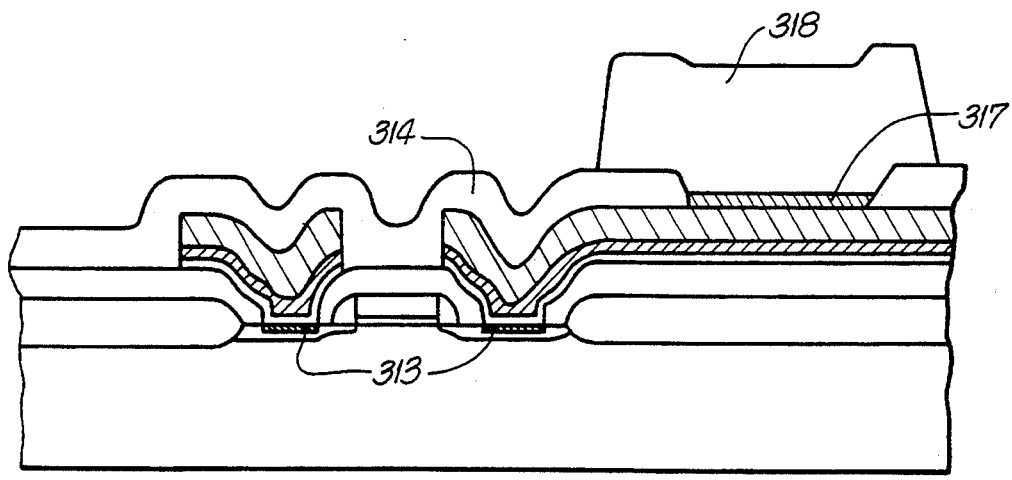

Then, as shown in FIG. 6(b) a passivation layer 314 is deposited and one or more openings are formed in layer 314 at each location where a contact button is to be formed. In each such opening, a electroless copper plating layer 317 having a thickness of the order of 1,000 Å is formed. Thereafter, an electroless nickel plating layer 318 is deposited on layer 317 to a thickness of about 20 microns, layer 318 constituting the contact button.

As mentioned above, the use of electroless plating permits the achievement of an improved contact and in particular promotes good adhesion of contact 318. In this embodiment, the underlying conductive material is formed by copper plating. However, even with the normal Al conductive layer, a contact button having high reliability can be obtained with the same structure as that described above. Moreover, Ni, Cu and Au can be used. According to one example, the button contact, to which a conductor can be soldered, can be formed on contact 318, made of Ni, Cu, or Au, by melt soldering.

Thus, the present invention provides an improved semiconductor device having a structure which eliminates certain shortcomings of conventional conductive layers and contact buttons. In particular, there are substantial improvements regarding coverage of the contact portions and conductive portions, as well as with respect to electro migration resistance, contact migration resistance and stress migration resistance.

Embodiment 4

Figure 7A:
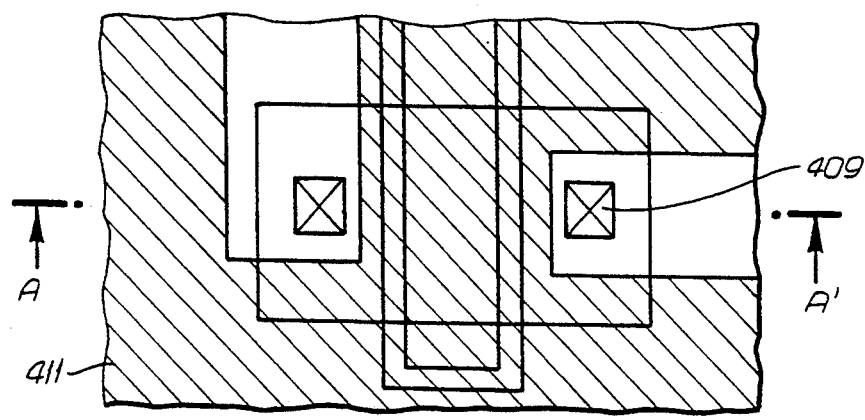
FIGS. 7(a) and (d) are plan views and FIGS. 7(b), (c) and (e) are cross-sectional views of successive stages in the fabrication of a fourth embodiment of a semiconductor device according to the present invention.
Figure 7B:
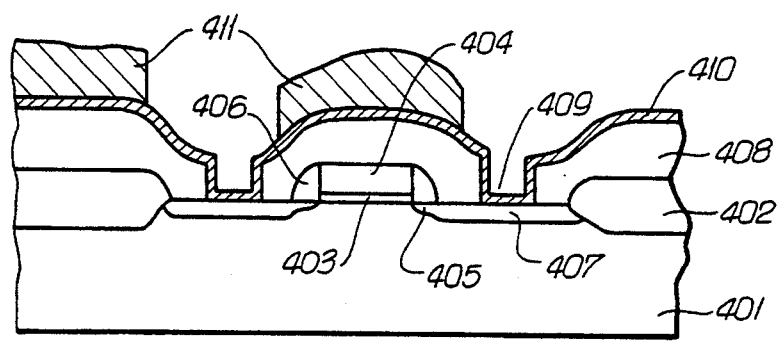
Figure 7C:
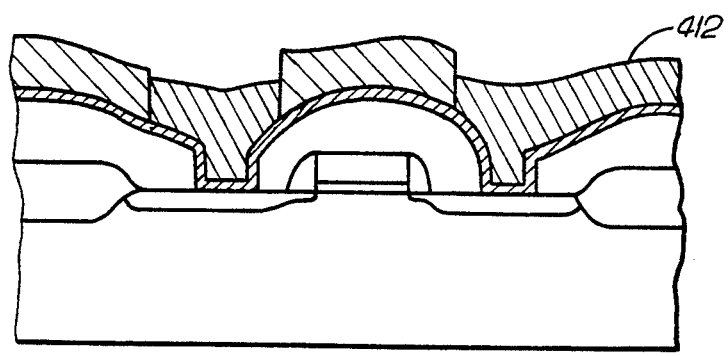
Figure 7D:
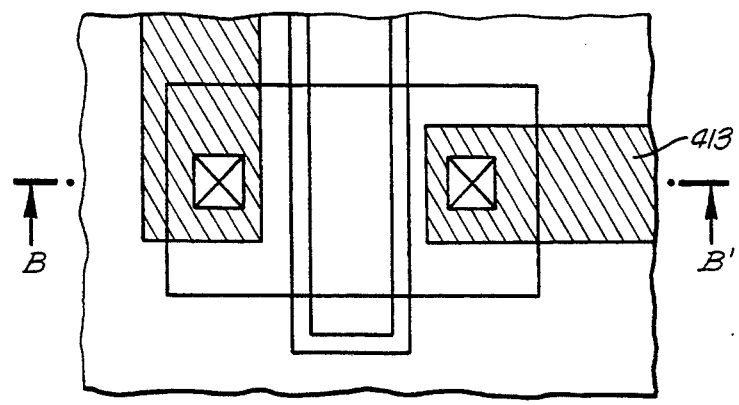
Figure 7E:
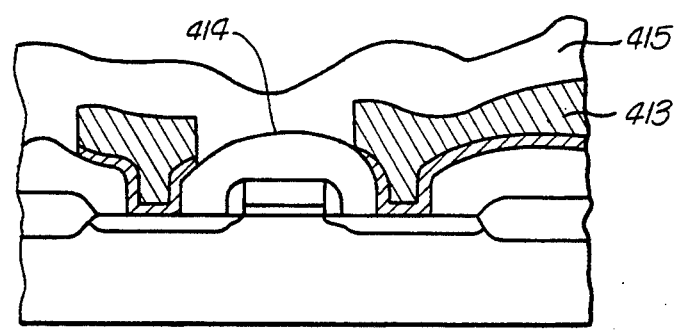

FIGS. 7(a) to (e) illustrates successive stages in the fabrication of a semiconductor device according to another embodiment of the invention. FIG. 7(a) is a plan view, FIG. 7(b) is a cross-sectional view along the line A—A' of FIG. 7(a), FIG. 7(c) is a view similar to that of FIG. 7(b), relative to a subsequent stage in the manufacturing process, FIG. (d) is plan view relating to a subsequent stage in the manufacturing procedure, and FIG. 7(e) is a cross-sectional view taken along the line B—B' of FIG. 7(b). This embodiment is directed primarily to the formation of conductive layers on a TiN/Ti layer structure.

In FIGS. 7, parts 401–408 correspond to parts 101–108 shown in FIGS. 4. Layer 408 is provided with contact openings 409. Layer 408 and contact openings 409 are covered by a TiN/Ti film 410 on which is formed a resist pattern 411, as shown in FIGS. 7(a) and 7(b). The other elements shown in FIGS. 7 include a copper conductive plating layer 412, 413, a region 414 from which TiN/Ti material is removed, and a passivation layer 415.

Referring specifically to FIG. 7(b), after formation of contact openings 409, which is achieved in a conventional manner, TiN/Ti layer 410 is formed on the entire exposed surface by sputtering, for example. TiN/Ti layer 410 is composed of a TiN sublayer having a thickness of the order of 1,000 Å and a Ti sublayer having a thickness of the order of 150 Å. After formation of layer 410, resist pattern 411 is applied to all regions where a conductive pattern is not to be provided. An exemplary resist pattern is shown in FIGS. 7(a) and 7(b).

Referring to FIG. 7(c), the conductive plating layer 412, 413 of copper is deposited to a thickness of the order of 1 micron, with layer 410 serving as the plating electrode. Layer 412,413 can be formed from a pyrophosphate acid Cu plating bath at a pH of 8,2, with a phosphorous composition of 7.2%, by weight, a bath temperature of 50° C. and a plating current density of 1A/dm$^2$.

Then, as shown in FIGS. 7(d) and (e), the resist pattern 411 is removed, after which those portions of the layer 410 which are exposed is removed by etching with an etching liquid of the $NH_4OH + H_2O_2$ series, after which a PSG or plasma nitride layer 415 is formed as the passivation layer.

As an alternative to the combination of copper plating on a TiN/Ti layer, it is possible to obtain a similar result by molybdenum plating on a $MoSi_{2.5}$ (molybdenum silicide rich in Si)/Ti layer, or nickel plating on a $TiSi_{2.5}/Zn$ structure. Furthermore, the plating layer can be applied even in a Ti-Salicide (self aligned silicide) process having a $TiSi_2$ layer in the diffused region from the beginning. In the embodiment described above, reference has been made only to a single conductive layer. However, this embodiment of the invention can also be applied for forming two or three conductive layers in an advantageous manner. It can equally be applied for forming contact buttons with the lower layer corresponding to layer 410 serving as the plating electrode except for Al. It is then possible to obtain good reliability in a manner which represents a clear improvement over the prior art. Since conductive paths composed of copper plating/TiN/Ti are obtained according to the present invention, the coverage properties of the conductive structure are excellent. Due to the presence of copper, low resistance, the prevention of protrusions, and good stress migration and electro migration properties can be obtained. The inner action between Cu-TiN-Ti-Si actually results in a Cu/TiN/-TiSi$_2$/Si structure as the result of a heating process performed at a temperature of the order of 400° C. In this case, the structure exhibits ideal conductive properties since the contact resistance between the various sublayers is very low, reactions do not occur, and variations in contact resistance are extremely small. Moreover, the occurrence of cracks and voids in the passivation layer can be eliminated entirely. The same effect is found regardless of whether electrolytic plating or electroless plating is employed. In particular, in the case of electroless copper plating, the conductive paths have good throwing power at the contact portion, low resistance and high reliability. Electroless copper plating can be performed using $CuSO_4$ $5H_2O + HCHO(35\%)$+alkanolamine series chelate (as a stabilizing agent) with a pH of 12-12.5 and at a temperature of 20°-50° C.

This embodiment lends itself to a number of variations. For example, it is possible to obtain similar results employing electroless nickel plating to form a Ni/-$MoSi_{2.0}$/Ti sequence, the individual layers having respective thicknesses of 1 micron, 1,000 Å and 150 Å, or with copper-tin electrolytic plating to form a Cu-Sn/ITO/Zr structure where the respective layers have thicknesses of 5,000 Å, 1,000 Å and 200 Å, etc. For the conductive oxide film, a sufficient barrier capability and adhesive force can be obtained by using films in the Y, Ba and Cu series, Sr, Ba and Cu series oxide films, etc, in addition to ITO. Since electroless plating offers good adhesive force and coverage, and has few pin holes, it can be used, in particular, for forming conductive regions in submicron contact areas.

Embodiment 5

Figure 8:
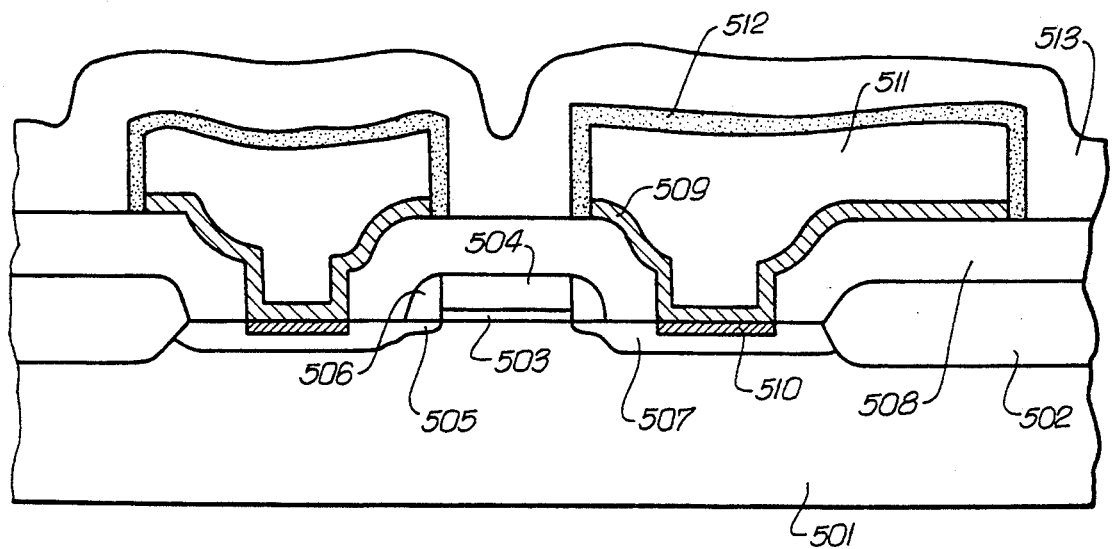
FIGS. 8, 9, 10, 11 and 12 are cross-sectional views of further embodiments of semiconductor devices according to the present invention.

FIG. 8 illustrates a further embodiment of the invention, which includes portions 501-508 that are identical to portions 101-108 of FIGS. 4.

After contact photoetching to form a structure as shown in FIG. 5(a), a $TaSi_{2.5}$/Ti layer 509 is deposited. This layer includes a $TaSi_{2.5}$ sublayer having a thickness of the order of 500 Å and a Ti sublayer having a thickness of the order of 150 Å. Layer 509 is treated by lump annealing of the halogen lump and so on in the presence of $N_2$ for a period of the order of 30 seconds at a temperature of the order 800° C. During this treatment, the Ti and Si react with one another to form the $TiSi_2$ layer 510 regions at the semiconductor contacts. Next, a resist pattern is formed at those locations where a conductive pattern is not to be provided. Then, in the regions where resist is not present, a copper layer is applied by electrolytic plating, utilizing a pyrroline acid copper plating bath, thereby forming a copper plating having a thickness of the order of 1.5 micron. During this process, periodically reversing (PR) current is employed as the current waveform.

When a periodically reversing current is employed, the current alternates between negative amplitude phases during which layer 509 serves as a cathode and positive amplitude phases during which layer 9 serves as an anode. During the negative phases, material is plated onto the layer 509, while during the positive phases, the deposited material is subjected to melting. By way of example, the periodically reversing current could be composed of negative phases having a duration of the order of 40 seconds alternating with positive phases having a duration of 10 seconds, with a current density of the order of 1A/dm$^2$ being employed.

With this procedure, the throwing power of the copper into each contact opening can be improved by deposition of solute at the anode. During each negative phase of the PR current, copper is deposited is such a manner as to take on a convex form. During the subsequent positive current phase, the copper is melted and acquires a more uniform thickness. Since the melting causes the copper conductive portions to become more uniform, coverage of the layer 509 with a uniform layer of copper is achieved.

Then, the resist material is removed and the portions of film 509 which are thus exposed is removed by etching, in this case copper layer 511 serves as an etching mask. Then, a nickel-phosphorus layer 512 having a thickness of the order of 500 Å is formed on conductive layer 511 by an electroless plating procedure. Finally, a passivation layer 513 is deposited on all exposed surfaces to complete the device.

Embodiment 6

Figure 9:
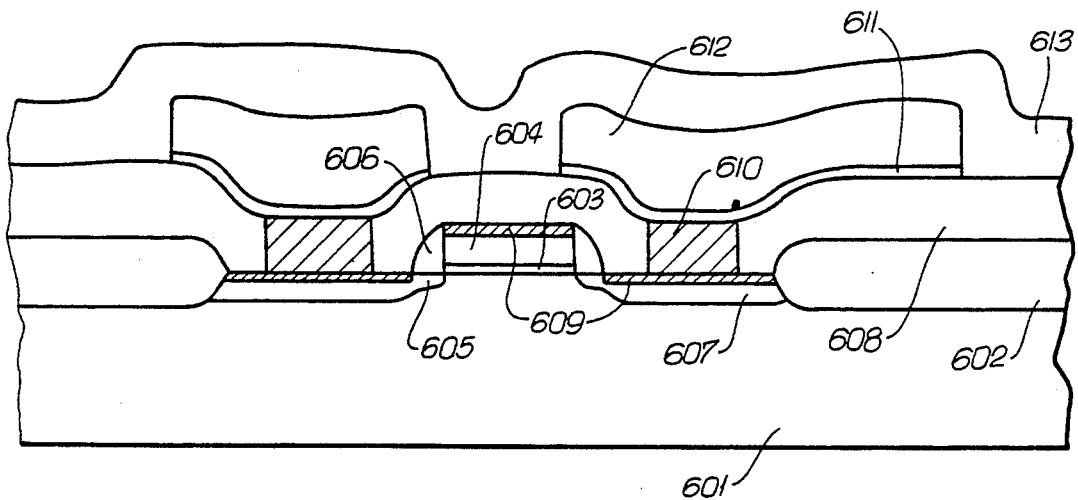

FIG. 9 shows a further embodiment in which portions 601-608 are identical to portions 101-108 of FIGS. 4.

After the formation of source and drain regions, the gate electrode and isolating insulating film 602 by conventional processes, $TiSi_2$ layer 609 is formed at the gate electrode and the diffused source and drain regions by a Ti-Salicide process. After the formation of contact openings by reactive ion etching, in which film 608 is selectively removed, nickel layers 610 are deposited by electroless plating only within the contact openings. The nickel plating layer grows from the lower $TiSi_2$-layer 609 and can be limited to the contact openings.

Then, a barrier metal layer 611 having a thickness of the order of 1,000 Å is deposited, followed by the application of a conductive layer 612 of the Al-Si-Cu series, having a thickness of the order of 1 micron, this being applied by sputtering. Then, by photoetching, the desired conductive pattern can be produced. Finally, the surface is completely covered by a passivation layer 613.

Nickel layer 610 can contain either P or B, and the same effect can be obtained without the provision of the barrier metal layer 611. Moreover, conductive plating, such as copper plating, for example, can be used as the barrier layer 611 on the electroless nickel plating layer 610, as described earlier in connection with other embodiments.

Embodiment 7

Figure 10:
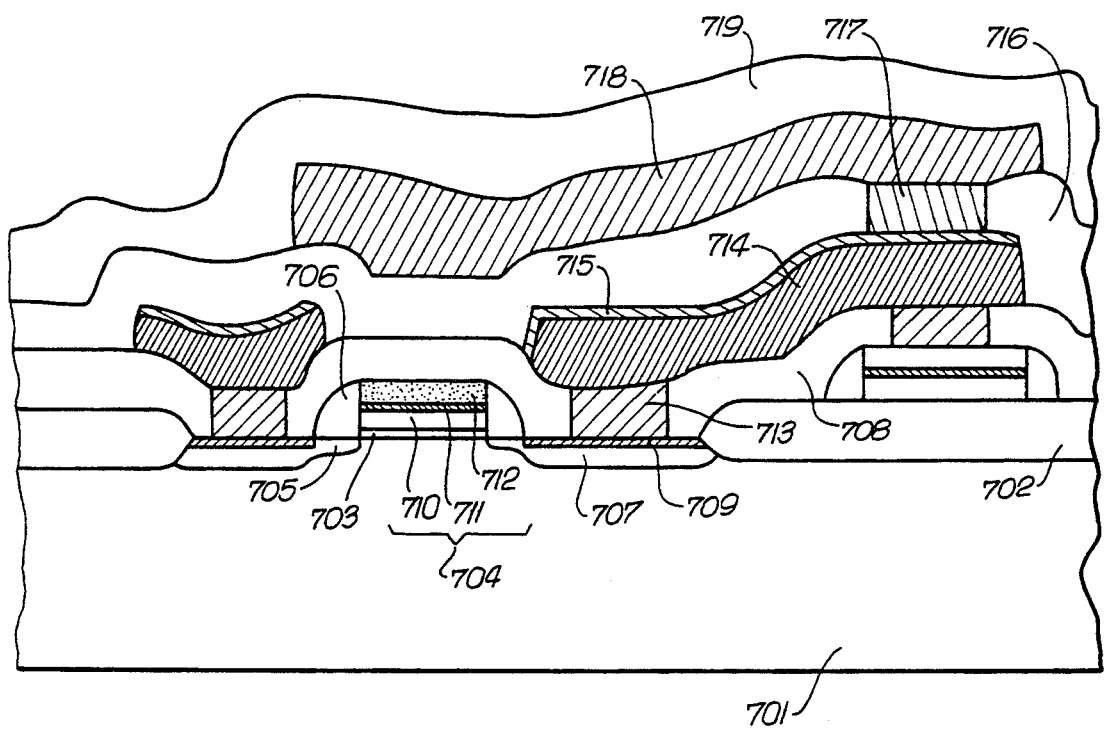

FIG. 10 shows a semiconductor device manufactured according to another embodiment of the invention, in which elements 701-708 are identical to elements 101-108 of FIGS. 4.

In FIG. 10, a gate electrode 704 is formed of a phosphorous doped polysilicon layer 710, a barrier metal layer 711 and a copper plating layer 712. The total thickness of gate electrode 704 is of the order of 4,000 Å and it is possible to reduce the resistance of gate electrode to a value which is less than 0.1 ohm per square. Contact openings are formed in layer 708 down to $TiSi_2$ layer 709, which is formed by Ti-Salicide, and which is thus on top of diffused region 707. Each contact opening is filled with an electroless nickel plating 713, and a first conductor layer is formed by forming an Al-Si series conductive layer 714 and a barrier metal layer 715. An interlayer insulating layer 716 is applied and one or more through holes are formed therein. Each hole is then filled with an electroless nickel plating 717.

Then, a conductive layer 718 composed of a layer of the Al-Si-Cu series and having a thickness of the order of 1 micron is deposited and the desired conductor pattern is formed therein by etching to produce the two-layer conductive path structure. Finally, a passivation layer 719 is applied to complete the device.

It is possible to form the conductive layer by plating and conductive elements 713-717 can be composed of Cu, Co, Au, Rh, Cr, soldering, etc., in addition to Ni. As concerns the barrier metal 715, a good effect can be achieved using a single layer or a combination layer of a metal having a high melting point, metal silicide, metal nitride, metal carbide, or a conductive oxide layer. Barrier layer 715 can also be a plated metal layer of Ni, etc.

As shown at the right-hand side of FIG. 10, a wiring structure 704' can be formed in the same process as electrode 704 and is composed of parts of layers 710, 711 and 712 so that electrode 704 is contiguous with wiring 704', although the connection therebetween does not appear in FIG. 10. Structure 704' constitutes connecting wiring for electrode 704

Embodiment 8

Figure 11:
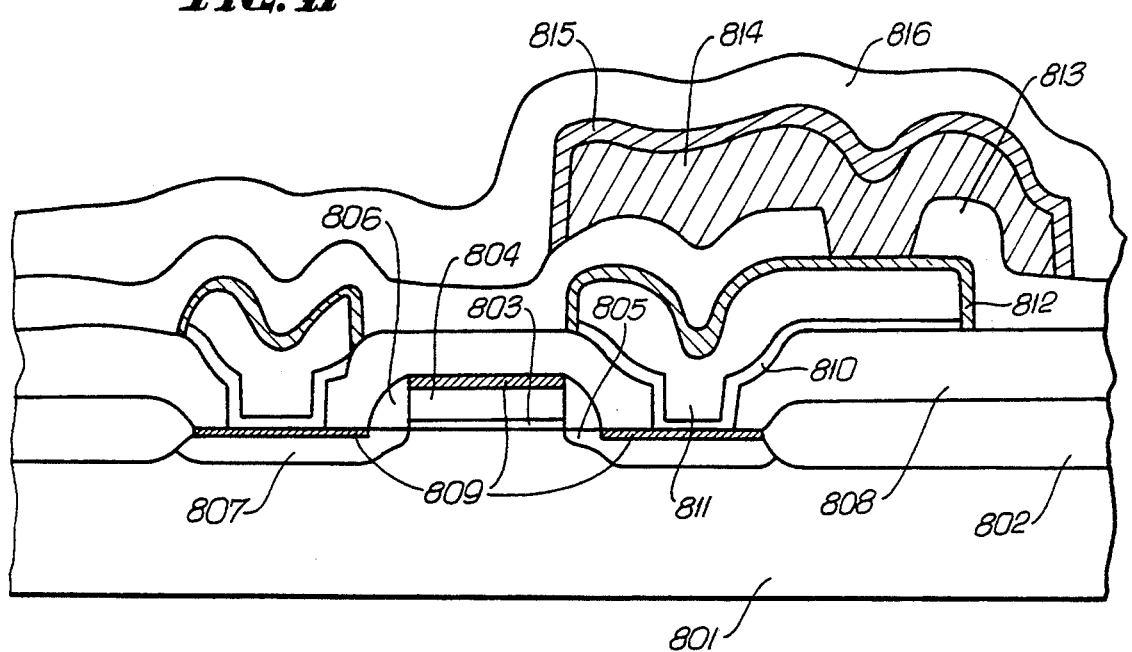

FIG. 11 shows a device constructed according to yet another embodiment of the invention, in which elements 801-808 are the same as elements 101-108 of FIGS. 4.

After the formation of $TiSi_2$ layer 809 on the gate source and drain regions, by a Ti-Salicide process, and photoetching, a barrier metal layer 810 of TiC having a thickness of 1,000 Å is deposited. Then a copper layer 811 having a thickness of the order of 5,000 Å is deposited by electrolytic plating and the desired conductive pattern is formed in layer 811 by an appropriate selective etching process. Thereafter, an electroless plating layer 812 of Cr, having a thickness of the order of 400 Å is deposited on the conductor pattern defined by layer 811.

Thereafter, an intermediate insulating layer 813 is deposited, one or more through openings are provided therein by photoetching, and a second conductive layer 814 of a material of the Al-Si-Cu series is formed by sputtering. Layer 814 is then given in the desired conductive pattern by photoetching and a layer 815 of Ni-P is applied by electroless plating onto the conductive pattern defined by the remaining portions of metal layer 814. Layer 815 has a thickness of the order of 500 Å. Finally, a passivation layer 816 is deposited to complete the device having a two-layer conductive structure. In this embodiment, the second conductive layer can be formed by copper plating and electroless Ni plating, as in the case of the first-described conductive layer.

Embodiment 9

Figure 12:
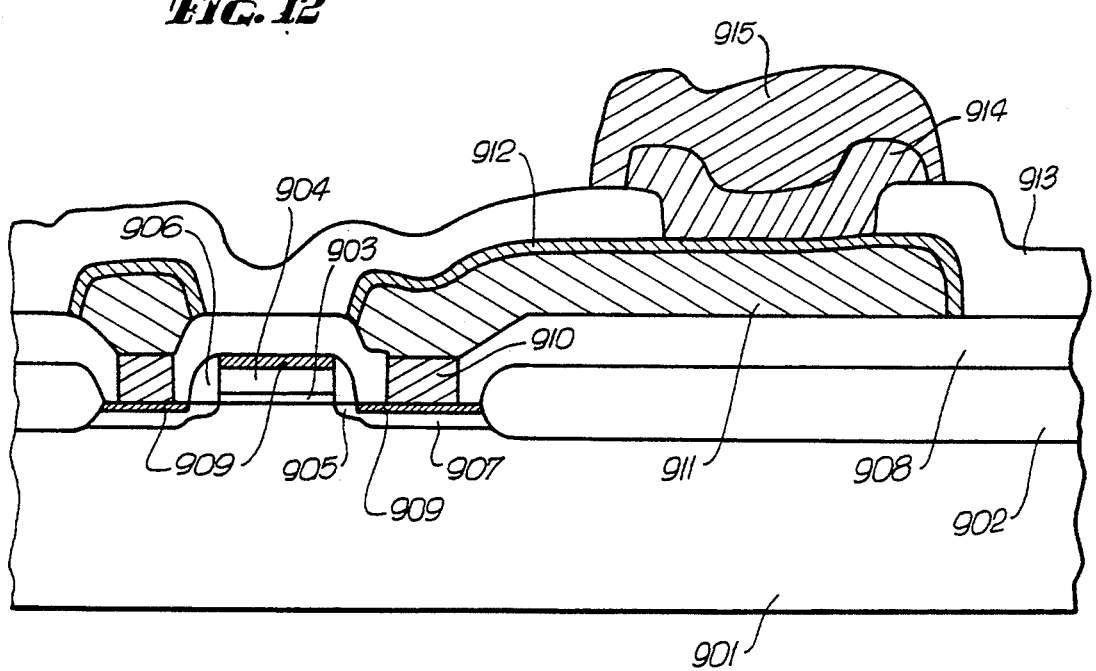

FIG. 12 illustrates a further embodiment of the invention in which elements 901-908 are the same as elements 101-108 of the embodiment of FIGS. 4. After the formation of a $TiSi_2$ layer 909 on the gate, source and drain regions by a Ti-Salicide process, and contact photoetching, copper regions 910 are formed by electroless plating. Then, a copper layer 911 is formed by electroless plating to have the desired conductor pattern. Thereafter, a Ni-P layer 912 is deposited on the conductor structure 911, layer 912 having a thickness of the order of 1,000 Å. Thereafter, a passivation layer 913 is deposited. Openings are formed in layer 913 by photoetching and a copper layer 914 is deposited in each opening by electroless plating to a thickness of the order of 20 microns. Then a soldering plate 915 is formed by electroless deposition to a depth of 20 microns to complete the production of a button contact.

Thus, as has been explained, the present invention provides improved, high reliability conductive path structures suitable for highly integrated semiconductor devices by forming the conductive path structures by combining electroless or electrolytic metal plating with various kinds of barrier metal, which is impossible in the prior art.

In the various embodiments of the invention, electrolytic Ni plating can be performed with a sulfaminic acid nickel+boric acid bath having a pH of 3.5 and at a temperature of 40°–50° C., employing a current density in the range of 2–30A/dm$^2$.

Electroless Ni plating can be performed, according to the present invention, employing sodium hypophosphorite as the reducing agent. Such a process is represented by the following equation:

$$Ni^{2+} + H_2PO_2^- + H_2O \rightarrow Ni + H_2PO_3^- + 2H^+$$

With a pH of 4–6, a temperature of 90° C., and a separation ratio of 13 microns per hours.

According to another possibility, a boron hydride compound can be used as the reducing agent, in a process according to the following equation:

$$4NiCl_2 + 2NaBH_4 + 6NaOH \rightarrow 2Ni_2B + 8NaCl + H_2O + H_2 \uparrow$$

What is claimed:

1. A method of fabricating a semiconductor device, comprising the steps of:

providing a substrate having a doped semiconductor region, and a gate wiring, forming a lower conductor structure, and contacting the metal plating layer and forming an insulating layer overlying said lower structure, and contacting the metal plating layer and having at least one through opening extending to said lower conductor structure; and forming an upper conductor structure which also includes a metal plating layer on the insulating layer and causing the upper conductor structure to be connected to the lower conductor structure via the through opening;

wherein each said step of forming a conductor structure is carried out by:

forming at least one layer of a metal, a metal silicide, a metal nitride, a metal carbide, or a conductive oxide film; and performing a plating operation in order to form the metal plating layer on the at least one layer, so that the metal plating layer adheres to the at least one layer; and wherein said steps of forming a lower conductor structure and an upper conductor structure are carried out so that the at least one layer of the upper conductor structure contacts the metal plating layer of the lower conductor structure.

2. A method of fabricating a semiconductor device, comprising the steps of:

providing a substrate having a doped semiconductor region, a gate wiring, a lower conductor structure which includes a metal plating layer, and an insulating layer overlying said lower structure and contacting metal plating layer and having at least one through opening extending to said lower conductor structure; and forming an upper conductor structure on the insulating layer and causing the upper conductor structure to be connected to the lower conductor structure via the through opening;

wherein said step of forming an upper conductor structure is carried out by:

forming at least one layer of a metal, a metal silicide, a metal nitride, a metal carbide, or a conductive oxide film;

performing a plating operation in order to form a metal plating layer on the at least one layer, so that the metal plating layer adheres to the at least one layer; and after said step of performing a plating operation, performing a thermal treatment in order to diffuse material from the plating layer into the at least one layer.

3. A method of fabricating a semiconductor device, comprising the steps of:

providing a substrate having a doped semiconductor region, a gate wiring, and an insulating layer overlying said semiconductor region and having at least one through opening; and forming a conductor structure on the insulating layer and causing the conductor structure to extend into the through opening;

wherein said step of forming a conductor structure is carried out by:

forming at least one conductor layer of a metal, a metal silicide, a metal nitride, a metal carbide, or a conductive oxide film;

forming a patterned resist layer on the at least one conductor layer, the patterned resist layer having at least one opening which exposes a part of the at least one conductor layer;

performing a plating operation in order to form a metal plating layer on the at least one conductor layer in the opening in the patterned resist layer, so that the metal plating layer adheres to the at least one conductor layer;

removing the patterned resist layer; and removing portions of the at least one conductor layer which are not covered by the metal plating layer, by an etching operation, using the metal plating layer as an etching mask.

* * * * *

UNITED STATES PATENT AND TRADEMARK OFFICE
CERTIFICATE OF CORRECTION

| | | |
|---|---|---|
| PATENT NO. | : 5,342,806 | Page 1 of 1 |
| APPLICATION NO. | : 07/780455 | |
| DATED | : August 30, 1994 | |
| INVENTOR(S) | : Michio Asahina | |

It is certified that error appears in the above-identified patent and that said Letters Patent is hereby corrected as shown below:

Col. 13, line 6;
Claim 1, line 4, delete "," (comma) following "region".

Col. 13, line 7;
Claim 1, line 5, replace ", and contacting the" with --which includes a--.

Col. 13, line 8;
Claim 1, line 6, insert --,-- (comma) after the first occurrence of "layer".

Col. 13, line 36;
Claim 2, line 6, insert --,-- (comma) after "structure".

Col. 13, line 37;
Claim 2, line 7, insert --the-- following "contacting".

Signed and Sealed this

Sixth Day of March, 2007

JON W. DUDAS
*Director of the United States Patent and Trademark Office*